(12) United States Patent
Tang et al.

(10) Patent No.: US 8,027,377 B2
(45) Date of Patent: Sep. 27, 2011

(54) DIFFERENTIAL DRIVER WITH COMMON-MODE VOLTAGE TRACKING AND METHOD

(75) Inventors: Bill R-S Tang, San Jose, CA (US); Paul D. Ta, Fremont, CA (US)

(73) Assignee: Intersil Americas Inc., Milpitas, CA (US)

( * ) Notice: Subject to any disclaimer, the term of this patent is extended or adjusted under 35 U.S.C. 154(b) by 1055 days.

(21) Appl. No.: 11/838,069

(22) Filed: Aug. 13, 2007

(65) Prior Publication Data
US 2008/0037617 A1    Feb. 14, 2008

Related U.S. Application Data

(60) Provisional application No. 60/822,301, filed on Aug. 14, 2006, provisional application No. 60/862,007, filed on Oct. 18, 2006.

(51) Int. Cl.
*H04B 1/38* (2006.01)
(52) U.S. Cl. ...................................................... 375/220
(58) Field of Classification Search .................. 375/220, 375/244
See application file for complete search history.

(56) References Cited

U.S. PATENT DOCUMENTS

2005/0035789 A1* 2/2005 Tamura et al. ................. 327/65
2006/0158223 A1* 7/2006 Wang et al. .................... 326/86
* cited by examiner

*Primary Examiner* — Kevin Kim
(74) *Attorney, Agent, or Firm* — Fogg & Powers LLC

(57) ABSTRACT

In a transceiver, a transmitter circuit is provided substantially the same common-mode voltage regardless of whether the transceiver is in a transmitting or receiving mode. In one embodiment, the transmitter circuit includes a driver circuit which, in the transmission mode of the transceiver, drives an output differential signal, and which, in the receiving mode of the transceiver, provides a termination circuit for an input differential signal. A variable resistor is provided to connect between a supply voltage and the driver circuit, the resistance of the variable resistor is selected such that the common-mode voltage of the output differential signal of the transmission mode substantially equals the common-mode voltage in the input differential signal of the receiving mode.

24 Claims, 3 Drawing Sheets

DIFFERENTIAL DRIVER WITH COMMON-MODE VOLTAGE TRACKING AND METHOD

REFERENCE TO RELATED APPLICATIONS

The present application is related to and claims priority to (a) copending U.S. provisional patent application, entitled "Differential Driver with Common-mode voltage Tracking and Method," Ser. No. 60/822,301, filed on Aug. 14, 2006; and (b) copending U.S. provisional patent application, entitled "Differential Driver with Common-mode voltage Tracking and Method," Ser. No. 60/862,007, filed on Oct. 18, 2006. The disclosures of the copending provisional applications are hereby incorporated by reference in their entireties.

BACKGROUND OF THE INVENTION

1. Field of the Invention

The present invention relates to high speed data communication (e.g., 1 G-bit/second or higher). In particular, the present invention relates to a bidirectional differential driver that maintains the same common-mode voltage for sending and receiving differential signals.

2. Discussion of the Related Art

Current-mode low-swing differential signals (LVDS) are often used in high speed data links to reduce electromagnetic interference (EMI), power consumption and noise interference. When a signal is transmitted over a significant distance between a transmitter and a receiver over copper wires, a technique—known as "AC coupling"—prevents a DC current from flowing between the receiver and transmitter as a result of a difference in ground or power supply voltages between the transmitter and the receiver on opposite sides of the transmission. AC coupling may be accomplished by inserting blocking capacitors into the communication link. This isolation technique allows two different common-mode voltages to exist at the transceivers at the ends of the communication channel. However, the different common-mode voltages may be limited or may cause errors, especially for bidirectional communication over a single communication link.

Full duplex is the preferred mode of bidirectional data communication. However, full-duplex bidirectional communication requires echo cancelling, and thus full-duplex mode is available only in low-speed data communication. At 1-Gbit/second or higher data rate, half-duplex mode is typically used. FIG. 1 shows schematically a bidirectional communication through link 100. At each end, a transceiver—consisting of both a transmitter and a receiver—performs the transmission and reception functions. For example, FIG. 1 shows transceivers 120 and 121. Transceiver 120 is shown to include transmitter 101 and receiver 102. Similarly, transceiver 121 is shown to include transmitter 103 and receiver 104. When transceiver 120 is in the transmitting mode, transceiver 121 is in the receiving mode. Within transceiver 120, when transmitter 101 is active (i.e., the transmission mode), receiver 102 is inactive. Conversely, in the receiving mode, transmitter 101 is inactive. In AC-coupled communication link 100, when transceiver 120 switches from a transmitting mode to a receiving mode, receiver 102's differential front end may experience an instantaneous large swing or surge in common-mode voltage, when the common-mode voltages are different between transmit and receive modes.

Such a voltage surge overlaps in time with the incoming signal and may overwhelm and blind receiver 102 until the surge condition settles down to within the receiver detection limits. When such a condition occurs, the receiver may lose its function until the common-mode voltage surge falls into the sensitivity range of the receiver. In a system where a differential termination resistor of 100 ohms and a blocking capacitor of 1 nF are used, the receiver may be blinded for a few hundred nanoseconds (ns). During this period, communication over the communication link is not possible.

FIG. 2 illustrates, in further detail, a general AC-coupled bidirectional communication system without common-mode voltage control. FIG. 2 shows the transmission systems of transceivers 200 and 250, which communicates over a communication link 270. As shown in FIG. 2, transceiver 200 includes transmitter 201 and receiver 202. Transceiver 250 is substantially identical to transceiver 200, except that transmitter 251 is disabled during receiving by grounding the input terminals of transmitter 251's differential driver circuit. In this configuration, transmitter 251 acts as a termination circuit during the receiving mode of transceiver 250.

FIG. 3 shows a waveform of output signal 212 from transceiver 200. As shown in FIG. 3, differential signal 212 is represented by the voltage difference between signal waveforms 212a and 212b. The common-mode voltage $V_{com\_TX}$ in differential signal 212 is given by:

$$V_{com\_TX} = \frac{V_{212a} + V_{212b}}{2},$$

where $V_{212a}$ and $V_{212b}$ are the component voltages of differential signal 212. The common-mode voltage $V_{com\_TX}$ in differential signal 212 is also given by:

$$V_{com\_TX} = V_{dd1} - \frac{V_{212a} - V_{212b}}{2} = V_{dd1} - \frac{\Delta V_1}{2},$$

where $\Delta V_1 = V_{212a} V_{212b}$ is the voltage swing in the transmitter output during transmission, and $V_{dd1}$ is the supply voltage of transceiver 200.

FIG. 4 shows a waveform of input differential signal 214 at receiver 250 on the output side of the blocking capacitors. As shown in FIG. 4, differential signal 214 is represented by the voltage difference between signal waveforms 214a and 214b. Because the input terminals of differential pair 215a and 215b are both grounded, no DC current flows in the two 50-ohm termination resistors, so that no voltage drop across these termination resistors in transmitter 251, the voltage levels of signal waveforms 214a and 214b swing above and below supply voltage $V_{dd2}$ at termination circuit 251. The common-mode voltage $V_{com\_RX}$ in differential signal 214 is given by:

$$V_{com\_RX} = \frac{V_{214a} + V_{214b}}{2},$$

where $V_{214a}$ and $V_{214b}$ are the component voltages of differential signal 214. The common-mode voltage $V_{com\_RX}$ in this instance equals supply voltage $V_{dd2}$, and the voltage levels of differential signal 214 are $$V_{dd2} + \frac{\Delta V_2}{2}$$

and $$V_{dd2} - \frac{\Delta V_2}{2}.$$

As illustrated by this example, the difference in common-mode voltage between transmission mode and receiving mode can be 50% of the differential signal swing. In such circumstances, the receiver may require as much time as 5 times the relevant RC time constant (i.e., 500 ns) to settle to less than 1% of this difference. In addition to all the possible variations in the manufacturing process, the supply voltage and temperature changes during operations, additional factors, such as (i) tail current boost-up, and (ii) pre-emphasis techniques can influence the common-mode voltage of a transmitter. These techniques are common in high-speed data communication, where high frequency loss is compensated in a long or lossy link.

In a bidirectional link, maintaining or tracking the common-mode voltage in a transceiver for both transmitting and receiving modes is essential to minimize the blind period during mode switching.

SUMMARY OF THE INVENTION

According to one embodiment of the present invention, a transceiver maintains substantially the same common-mode voltage in a transmitting mode as in a receiving mode. A transmitter circuit in the transceiver includes a driver circuit which, in the transmission mode of the transceiver, drives an output differential signal, and which, in the receiving mode of the transceiver, provides a termination circuit for an input differential signal. In one embodiment, the common-mode voltage is maintained when the transceiver switches from the transmitting mode to the receiving mode, and vice versa, by a resistive network.

The present invention is better understood upon consideration of the detailed description below and the accompanying drawings.

BRIEF DESCRIPTION OF THE DRAWINGS

To facilitate cross-referencing, like elements in the figures are assigned like reference numerals.

DETAILED DESCRIPTION OF THE PREFERRED EMBODIMENTS

The present invention provides a new transceiver that provides substantially the same common-mode voltage whether the transceiver is in a transmitting mode or in a receiving mode.

Figure 1:
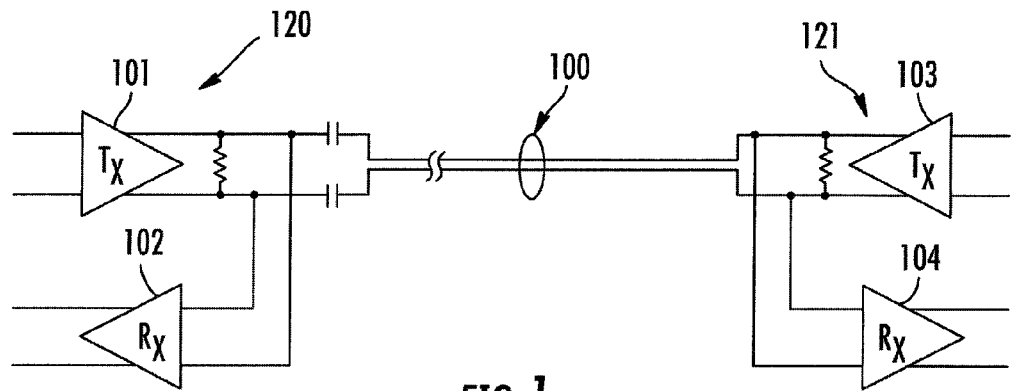
FIG. 1 shows schematically a bidirectional communication link 100.
Figure 2:
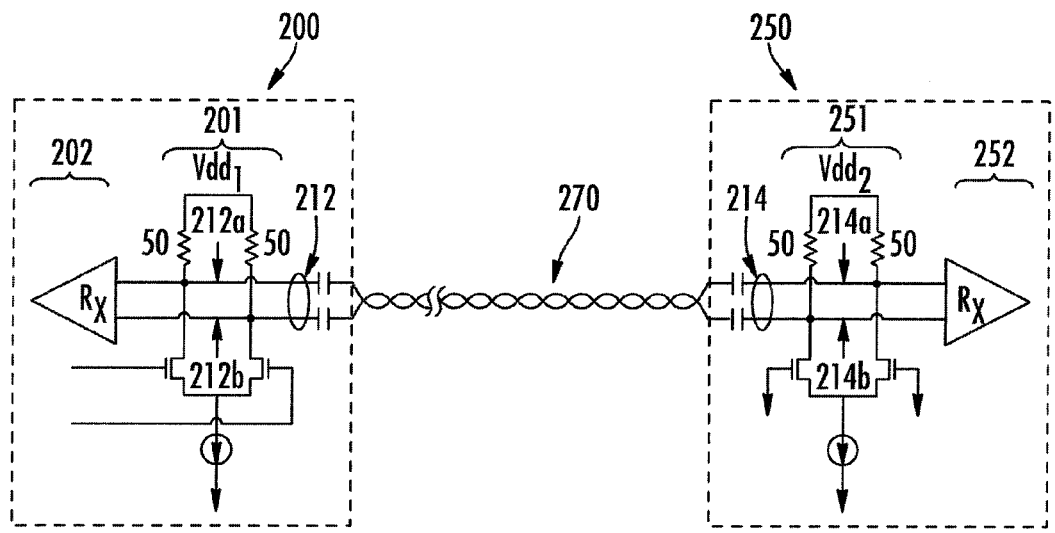
FIG. 2 shows the transmission circuits in communicating transceiver 200 in transmission mode and transceiver 250 in receiving mode over a communication link 270.
Figure 3:
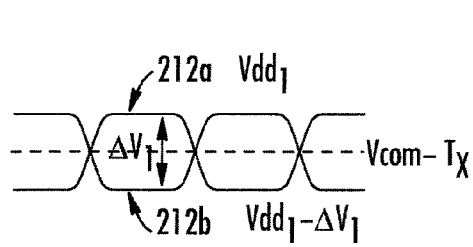
FIG. 3 shows a waveform of output signal 212 from transceiver 200.
Figure 4:
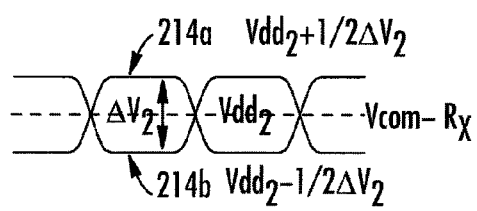
FIG. 4 shows a waveform of input differential signal 214 at receiver 250.
Figure 5A:
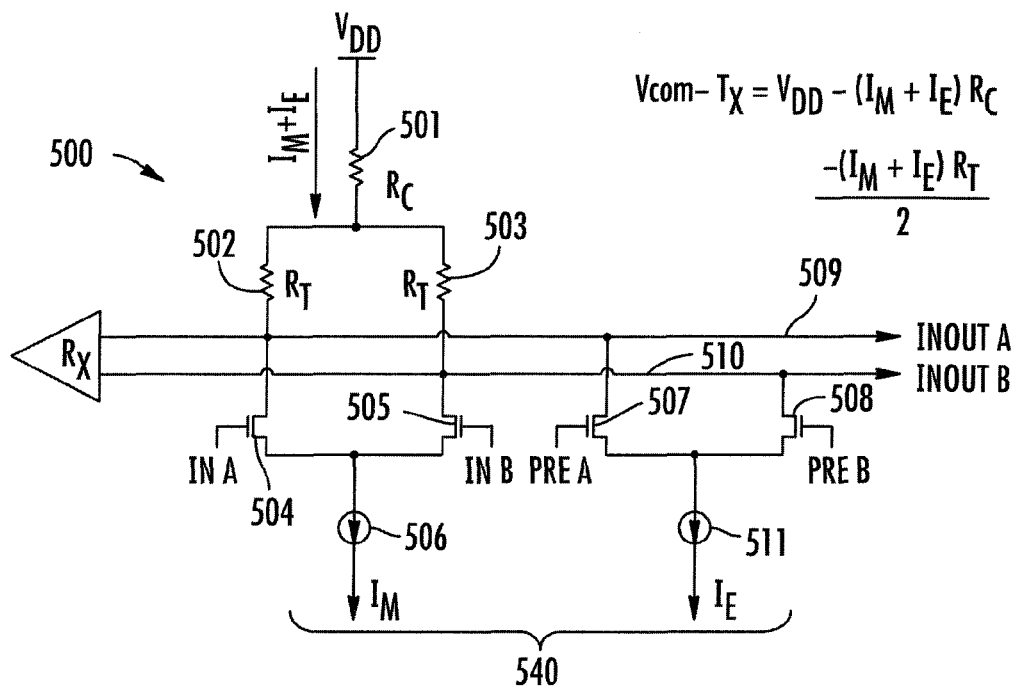
FIG. 5a shows a circuit model for transceiver circuit 500 during a transmission operation, according to one embodiment of the present invention.

FIG. 5a shows a circuit model for transceiver circuit 500 during a transmission operation, according to one embodiment of the present invention. As shown in FIG. 5a, transceiver 500 includes a common-mode voltage control resistor 501, having resistance $R_C$, provided between supply voltage $V_{DD}$ and a common terminal of termination resistors 502 and 503, each having a resistance $R_T$. Resistors 501, 502 and 503 are assigned these resistance values to allow common-mode voltage control. During transmission, signals INA and INB are provided at the differential input of transistor 504 and 505 in transceiver 500. The differential pair 504 and 505 are the main output driver transistors of output terminals 509 and 510. Signals PREA and PREB are provided as differential input signals to drive pre-emphasis output driver transistors 507 and 508. In this configuration, the common mode voltage during transmission mode is given by:

$$V_{com\_TX} = \frac{V_{INOUTA} + V_{INOUTB}}{2} =$$
$$V_{DD} - \left( (I_M + I_E)R_C + \frac{(I_M + I_E)R_T}{2} \right) = V_{DD} - (I_M + I_E)\left(R_C + \frac{R_T}{2}\right)$$

As shown in FIG. 5a, $V_{com\_TX}$ depends both on main tail current $I_M$ and pre-emphasis current $I_E$ at fixed $R_C$ and $R_T$.

Figure 5B:
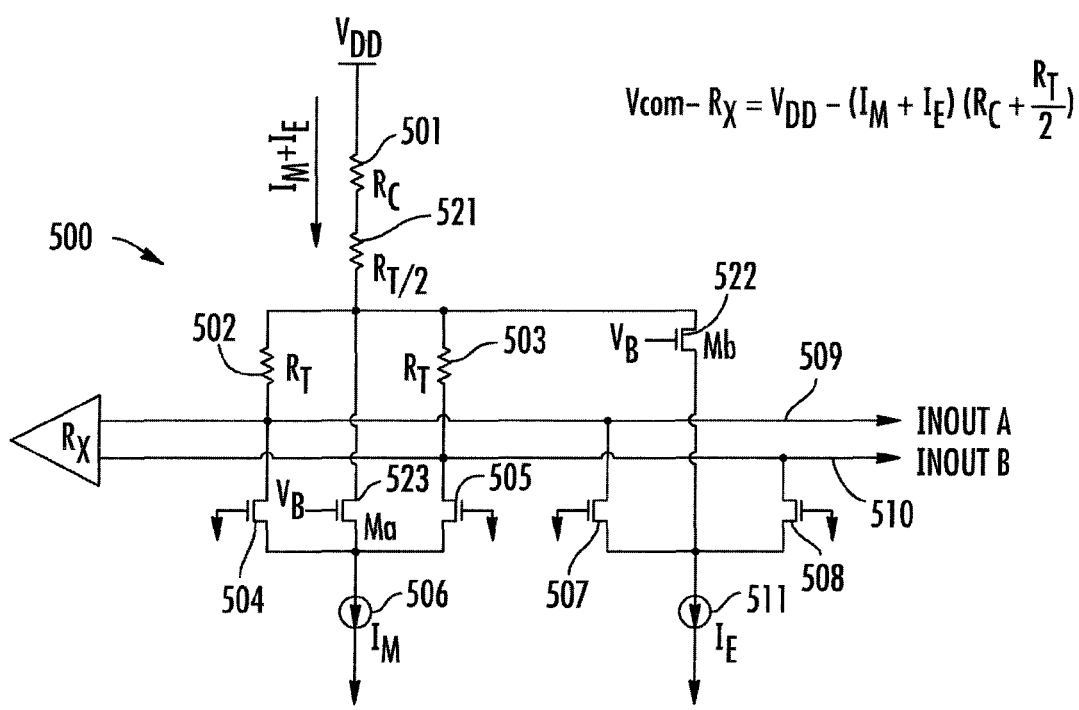
FIG. 5b shows a circuit model for transceiver circuit 500 during a receiving operation, according to one embodiment of the present invention.

FIG. 5b shows a circuit model for transceiver circuit 500 during a receiving operation, according to one embodiment of the present invention. As shown in FIG. 5b, in addition to the elements of transceiver circuit 500 shown in FIG. 5a, the circuit model in FIG. 5b includes resistor 521, having a resistance $$\frac{R_T}{2}$$

(i.e., one-half of the resistance of each of termination resistors 502 or 503), and transistors 522 and 523. During a receiving mode, the main output driver transistors 504 and 505 and pre-emphasis driver transistors 507 and 508 are rendered non-conducting by grounding their respective input terminals. Transistors 522 and 523 allow tracking in the receiving mode the common-mode voltage established in the transmission mode by the values of main tail current $I_M$ and pre-emphasis current $I_E$. Transistors 522 and 523 are biased at input voltage $V_B$, which is selected to maintain in the receiving mode the same DC current (i.e., both of the currents in main output driver $I_M$ and pre-emphasis driver $I_E$) as in the transmission mode. In this manner, a suitable voltage drop across the common mode voltage control resistors 501 and 521 is achieved. In this configuration, the common mode voltage $V_{com\_RX}$ of transceiver 500 during a receiving mode is given by:

$$V_{com\_RX} = \frac{V_{INOUTA} + V_{INOUTB}}{2} = V_{DD} - (I_M + I_E)\left(R_C + \frac{R_T}{2}\right),$$

which is equal to the $V_{com\_TX}$ illustrated in FIG. 5a. Thus, no surge or very small variation in common-mode voltage would be seen when transceiver 500 switches from a transmission mode to a receiving mode.

Figure 5C:
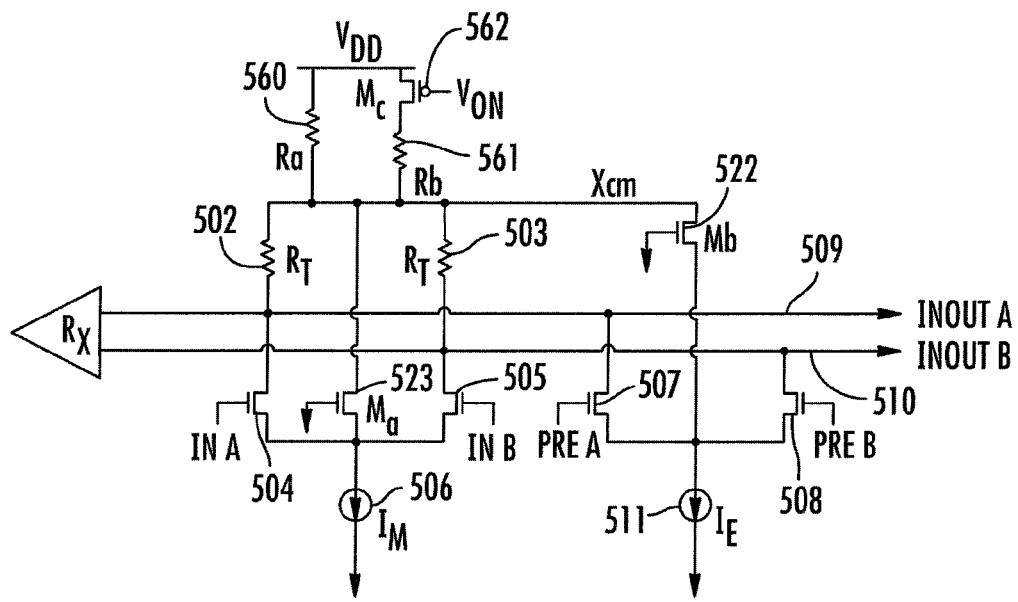
FIG. 5c shows one implementation for transceiver circuit 500, together with relevant input and control voltages during a transmission operation, according to one embodiment of the present invention.

FIG. 5c shows one implementation for transceiver circuit 500, together with relevant input and control voltages during transmission, according to one embodiment of the present invention. As shown in FIG. 5c, transistor 562 is provided as a switch to connect and to disconnect resistor 561 (having resistance $R_b$) in a parallel resistive circuit with resistor 560 (having resistance $R_a$), during a transmission mode and a receiving mode, respectively. During the transmission mode, transistor 562 is rendered conducting by biasing voltage $V_{ON}$, such that the parallel resistive circuit[1], including transistor 562 (with "on-resistance" $R_M$), can effectively realize the resistance $R_c$ as illustrated in FIG. 5a. As seen in FIG. 5c, transistor 522 and 523 are rendered non-conducting (i.e., open circuits) by grounding their respective input terminals.

[1] Resistance of the parallel resistive circuit is given by:

$$R_a \| (R_M + R_b) = \frac{R_a(R_M + R_b)}{R_a + R_M + R_b}$$

Figure 5D:
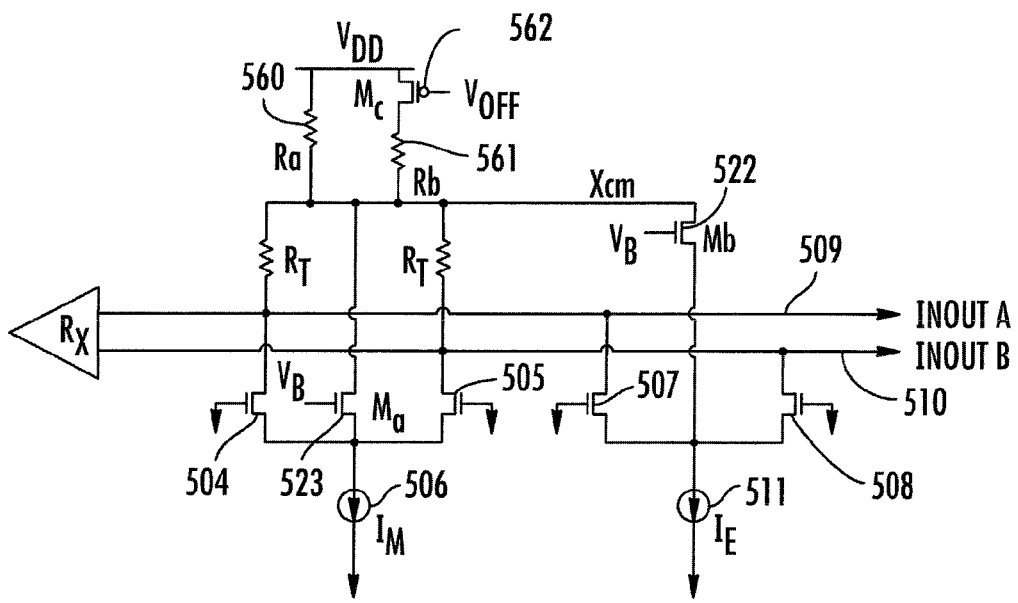
FIG. 5d shows one implementation for transceiver circuit 500, together with relevant input and control voltages during a receiving operation, according to one embodiment of the present invention.

Similarly, as shown in FIG. 5d, during a receiving mode, transistor 562 is rendered an open circuit by biasing voltage $V_{OFF}$, such that resistor 560 (with resistance $R_a$) which was deliberately chosen to have the value $(R_C+R_T/2)$ as showing in FIG. 5b. In this configuration, transistors 522 and 523 are biased by voltage $V_B$ such that their currents can mimic main tail current $I_M$ and pre-emphasis current $I_E$ during transmission mode.

The detailed description above is provided to illustrate the specific embodiments of the present invention and is not intended to be limiting. Numerous variations and modifications within the scope of the present invention are possible. The present invention is set forth in the following claims.

We claim:

1. A transceiver circuit having a transmission mode and a receiving mode, comprising:
    a receiver circuit for receiving an input differential signal during the receiving mode;
    a transmitter driver circuit wherein, in the transmission mode, the transmitter driver circuit drives an output differential signal, and wherein, in the receiving mode, the transmitter driver circuit provides a termination circuit for the input differential signal and provides for tracking a current that is provided in the transmission mode; and
    a variable resistive circuit connecting between a supply voltage and the transmitter driver circuit wherein, in the transmission mode, the variable resistive circuit provides a first resistance and wherein, in the receiving mode, the variable resistive circuit provides a second resistance, such that a common-mode voltage of the output differential signal substantially equals a common-mode voltage in the input differential signal at the termination circuit.

2. A transceiver as in claim 1, wherein the variable resistive circuit comprises a resistor network in which one or more switches are provided to connect resistors in the resistor network.

3. A transceiver as in claim 2, wherein the variable resistive circuit includes a first resistive current path and a second resistive current path, wherein the switches disconnect the second resistive current path during the receiving mode.

4. A transceiver as in claim 1, wherein the transmitter driver circuit is rendered non-conducting during the receiving mode, and wherein the variable resistive circuit further comprises one or more switches which operate in the receiving mode to conduct a current approximating a current drawn by the transmitter driver circuit in the transmission mode.

5. A transceiver as in claim 1, wherein the transmitter driver circuit provides a current comprising a tail current.

6. A transceiver as in claim 1, wherein the transmitter driver circuit provides a current comprising a pre-emphasis current.

7. A transceiver as in claim 1, wherein the current that is provided in the transmission mode tracks a tail current.

8. A transceiver as in claim 1, wherein the current that is provided in the transmission mode tracks a pre-emphasis current.

9. A transceiver as in claim 1, wherein the variable resistive circuit comprises a resistor having a resistance substantially equal to one-half the resistance of the termination circuit.

10. A method for maintaining a common-mode voltage in a transceiver circuit which provides an output differential signal during a transmission mode and receives an input differential signal during a receiving mode, comprising:
    providing a transmitter driver circuit which, in the transmission mode, drives the output differential signal, and wherein, in the receiving mode, provides a termination circuit for the input differential signal and provides a current that is provided in the transmission mode; and
    providing a first resistance between a supply voltage and the transmitter driver circuit during the transmission mode and providing a second resistance in the receiving mode, such that a common-mode voltage of the output differential signal substantially equals a common-mode voltage in the input differential signal at the termination circuit.

11. A method as in claim 10, wherein the first resistance and the second resistance are provided by a variable resistive circuit which comprises a resistor network in which one or more switches are provided to connect resistors in the resistor network.

12. A method as in claim 11, wherein the variable resistive circuit includes a first resistive current path and a second resistive current path, further comprising using the switches to disconnect the second resistive current path during the receiving mode.

13. A method as in claim 12, wherein the transmitter driver circuit is rendered non-conducting during the receiving mode, further comprising providing one or more switches which operate in the receiving mode to conduct a current approximating a current drawn by the transmitter driver circuit in the transmission mode.

14. A method as in claim 10, further comprising providing in a transmitter a tail current.

15. A method as in claim 10, further comprising providing in a transmitter a pre-emphasis current.

16. A method as in claim 10, wherein the current that is provided in the transmission mode tracks a tail current.

17. A method as in claim 10, wherein the current that is provided in the transmission mode tracks a pre-emphasis current.

18. A method as in claim 10, wherein providing the first resistance comprises providing a resistor having a resistance substantially equal to one-half the resistance of the termination circuit.

19. A transceiver that maintains a common-mode voltage between a transmission mode and a receiving mode, comprising:
  means for driving an output differential signal in the transmission mode, for providing a termination circuit for the input differential signal in the receiving mode, and for tracking in the receiving mode a current that is provided in the transmission mode; and
  means for providing a first resistance between a supply voltage and the transmitter driver circuit during the transmission mode and providing a second resistance in the receiving mode, such that a common-mode voltage of the output differential signal substantially equals a common-mode voltage in the input differential signal at the termination circuit.

20. A transceiver as in claim 19, wherein the means for providing a first resistance comprises a resistor network in which one or more switches are provided to connect resistors in the resistor network.

21. A transceiver as in claim 20, wherein the resistor network includes a
  first resistive current path and a second resistive current path, further comprising using the switches to disconnect the second resistive current path during the receiving mode.

22. A transceiver as in claim 19, further comprising means for providing a tail current.

23. A transceiver as in claim 19, further comprising means for providing a pre-emphasis current.

24. A transceiver as in claim 19, wherein the means for providing a first resistance comprises a resistor having a resistance substantially equal to one-half the resistance of the termination circuit.

* * * * *